(12) United States Patent
Cao et al.

(10) Patent No.: US 10,096,793 B2
(45) Date of Patent: Oct. 9, 2018

(54) PACKAGE FOR DEVICE TO BE PACKAGED, MANUFACTURING METHOD THEREOF, AND OLED APPARATUS COMPRISING THE PACKAGE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yujing Cao, Beijing (CN); Song Song, Beijing (CN)

(73) Assignees: BOE TECHNOLOGY GROUP CO., LTD, Beijing (CN); BEIJING BOE OPTOELECTRONICS TECHNOLOGY CO., LTD, Beijing (CN)

( * ) Notice: Subject to any disclaimer, the term of this patent is extended or adjusted under 35 U.S.C. 154(b) by 40 days.

(21) Appl. No.: 15/098,495

(22) Filed: Apr. 14, 2016

(65) Prior Publication Data

US 2017/0018731 A1    Jan. 19, 2017

(30) Foreign Application Priority Data

Jul. 17, 2015   (CN) .......................... 2015 1 0424960

(51) Int. Cl.
*H01L 29/08*     (2006.01)
*H01L 35/24*     (2006.01)
(Continued)

(52) U.S. Cl.
CPC ........ *H01L 51/524* (2013.01); *H01L 51/5253* (2013.01); *H01L 51/5259* (2013.01)

(58) Field of Classification Search
CPC ............. H01L 51/5246; H01L 51/5256; H01L 51/5259
See application file for complete search history.

(56) References Cited

U.S. PATENT DOCUMENTS 6,624,568 B2 *   9/2003  Silvernail ........... H01L 51/5237
                                                          313/504
2002/0113548 A1   8/2002  Silvernail
(Continued)

FOREIGN PATENT DOCUMENTS

CN         1957485 A       5/2007
CN       101156258 A       4/2008
(Continued)

OTHER PUBLICATIONS

CN First Office Action for application No. 201510424960.5, dated Aug. 31, 2016, 14pp.

*Primary Examiner* — Joseph C Nicely
*Assistant Examiner* — Wilner Jean Baptiste
(74) *Attorney, Agent, or Firm* — Armstrong Teasdale LLP

(57) ABSTRACT

A package is provided. The package includes a base substrate includes a first surface, a second surface opposite the first surface, and a side face, wherein a device to be packaged is formed on the first surface, and a packaging cover-plate surrounding the first surface of the base substrate and directly coupled to at least one of the side face and the second surface of the base substrate, wherein the device to be packaged is formed in an enclosure space defined by the packaging cover-plate and the base substrate.

6 Claims, 3 Drawing Sheets

(51) Int. Cl.
*H01L 51/00* (2006.01)
*H01L 51/52* (2006.01)

(56) References Cited

U.S. PATENT DOCUMENTS

| | | | |
|---|---|---|---|
| 2003/0143423 A1* | 7/2003 | McCormick | H01L 51/5237 428/690 |
| 2006/0278965 A1 | 12/2006 | Foust et al. | |
| 2011/0114994 A1* | 5/2011 | Mandlik | C23C 16/02 257/100 |
| 2015/0228925 A1* | 8/2015 | Chen | H01L 51/5253 257/40 |

FOREIGN PATENT DOCUMENTS

| | | |
|---|---|---|
| CN | 101218692 A | 7/2008 |
| CN | 101819985 A | 9/2010 |
| CN | 101933174 A | 12/2010 |
| CN | 102210035 A | 10/2011 |
| CN | 103474561 A | 12/2013 |
| CN | 104103768 A | 10/2014 |
| CN | 104638189 A | 5/2015 |
| CN | 104638200 A | 5/2015 |
| JP | H105242966 A | 9/1993 |
| WO | 2014115825 A1 | 7/2014 |

\* cited by examiner

PACKAGE FOR DEVICE TO BE PACKAGED, MANUFACTURING METHOD THEREOF, AND OLED APPARATUS COMPRISING THE PACKAGE

CROSS REFERENCE TO RELATED APPLICATIONS

This application claims priority of Chinese Patent Application No. 201510424960.5, filed on Jul. 17, 2015, the entire content of which is incorporated by reference herein as a part of this application.

BACKGROUND

Embodiments of the present invention relate to a package, a manufacturing method thereof and an OLED apparatus.

Organic light-emitting diodes (OLEDs) have been expected to be applied in flat panel displays of next generation because of their characteristics of all-solid-state, active luminescence, high brightness, high contrast, ultra thinness and ultra light-weight, low power consumption, having no limit on view angle, wide operation temperature range and the like.

A critical problem that currently hampers the development of OLED industry is the lifetime of an OLED device. Through a lot of tests and analysis, it has been found that the failure of an OLED is mainly due to the failure of the miniature electrolytic cell of the OLED device. Specifically, because the OLED device is a device driven by a direct-current, a miniature electrolytic cell will be formed therein when the OLED device is in an operation state if there is water vapor in the device, and an electrochemical reaction will occur. The gas produced by the reaction will separate the metal cathode from the organic functional layer, which causes the failure of the device.

FIG. 1 shows a package structure of an OLED device in the prior art which comprises a base substrate 1, an OLED device 2 formed on the base substrate 1, and a packaging cover-plate 30 for packaging the OLED device 2. As shown in FIG. 1, water vapor can still enter the OLED device through the packaging cover-plate in the package structure of the prior art, which decreases the luminous efficiency of the OLED device and reduces the lifetime thereof.

BRIEF DESCRIPTION

Embodiments described herein provide a package, a manufacturing method thereof and an OLED apparatus so as to achieve a desired effect of preventing water vapor from corroding the packaged device (for example, an OLED device).

In a first aspect, a package is provided. The package includes a base substrate including a first surface and a second surface that are opposed to each other and a side face, the first surface of the base substrate being used for forming a device to be packaged thereon, and a packaging cover-plate surrounding the first surface of the base substrate and being at least in closed connection with the side face and/or the second surface of the base substrate, the device to be packaged being formed in an enclosure space formed by the packaging cover-plate and the base substrate.

In one embodiment, an enclosure space formed by the base substrate, the packaging cover-plate and the device to be packaged has a water-absorbing and/or oxygen-absorbing material filled therein.

In one embodiment, the package further includes a packaging film formed in an enclosure space formed by the packaging cover-plate and the base substrate, the packaging film is in closed connection with the first surface of the base substrate, and the device to be packaged is formed in the enclosure space formed by the packaging film and the base substrate.

In one embodiment, the packaging film is formed by alternately stacking a layer of organic material and a layer of inorganic material.

In one embodiment, the packaging cover-plate is formed of plastic.

In a second aspect, a manufacturing method of a package is provided. The method includes forming a device to be packaged on a first surface of a base substrate, the base substrate comprising the first surface and a second surface that are opposed to each other and a side face, forming a packaging cover-plate extending beyond the base substrate above the first surface of the base substrate and the device to be packaged, bending a part of the packaging cover-plate that extends beyond the base substrate toward the second surface of the base substrate, and making the packaging cover-plate be at least in closed connection with the side face and/or the second surface of the base substrate.

In one embodiment, before making the packaging cover-plate at least in closed connection with the side face and/or the second surface of the base substrate, the method further includes filling a water-absorbing and/or oxygen-absorbing material in an enclosure space formed by the base substrate, the packaging cover-plate, and the device to be packaged.

In one embodiment, after forming the device to be packaged on the first surface of the base substrate and before forming the packaging cover-plate extending beyond the base substrate above the first surface of the base substrate and the device to be packaged, the method further includes forming a packaging film in closed connection with the first surface of the base substrate on the first surface of the base substrate, wherein the device to be packaged is formed in an enclosure space formed by the packaging film and the base substrate.

In a third aspect, an OLED apparatus including the package provided in the first aspect is provided, wherein the device to be packaged is an OLED device.

The embodiments of the described herein provide a package, a manufacturing method thereof and an OLED apparatus, in which the device to be packaged is formed on the first surface of the base substrate, the packaging cover-plate surrounds the first surface of the base substrate and is in closed connection with the side face and/or the second surface of the base substrate. This lengthens the path along which water and oxygen travel to the device to be packaged and makes it more difficult for water and oxygen to corrode the device to be packaged.

BRIEF DESCRIPTION OF THE DRAWINGS

For the sake of describing the embodiments of the disclosure or the prior art more clearly, the accompany drawings of the embodiments or the prior art will be briefly introduced below, and obviously, the accompany drawings described below merely relate to some embodiments of the disclosure and are not a limitation to the present disclosure, and an ordinary skilled person in the art may obtain other embodiments according to these drawings without creative work.

DETAILED DESCRIPTION

The technical solutions of the embodiments described herein will be described clearly and thoroughly hereinafter in conjunction with the drawings in respective embodiments. Obviously, the embodiments described are only some rather than all of the embodiments of the disclosure. Other embodiments made by those ordinary persons skilled in the art based on the embodiments described herein without creative work will all fall into the scope of the disclosure.

Figure 1:
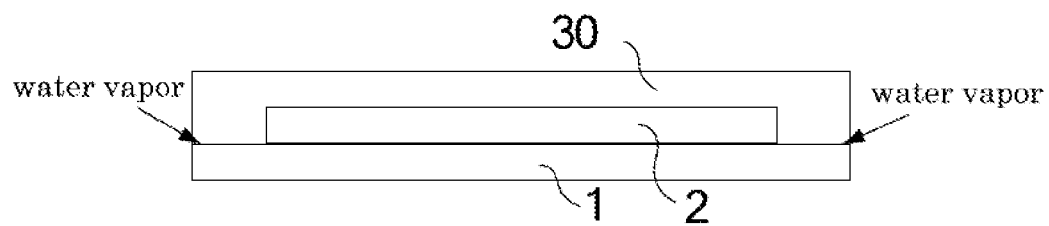
FIG. 1 is a schematic sectional diagram of a package structure of an OLED device in the prior art.
Figure 2:
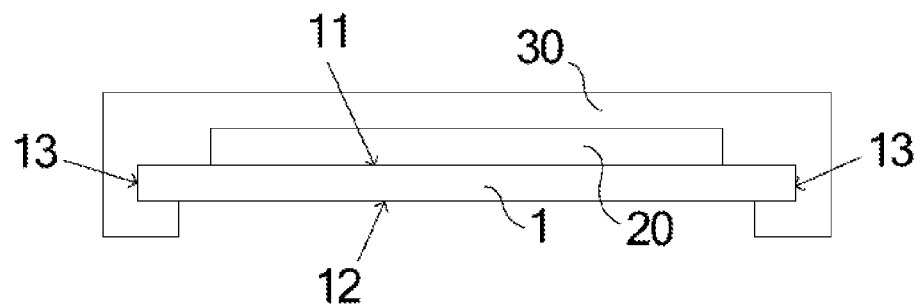
FIG. 2 is a schematic sectional diagram of a package provided by an embodiment.
Figure 3:
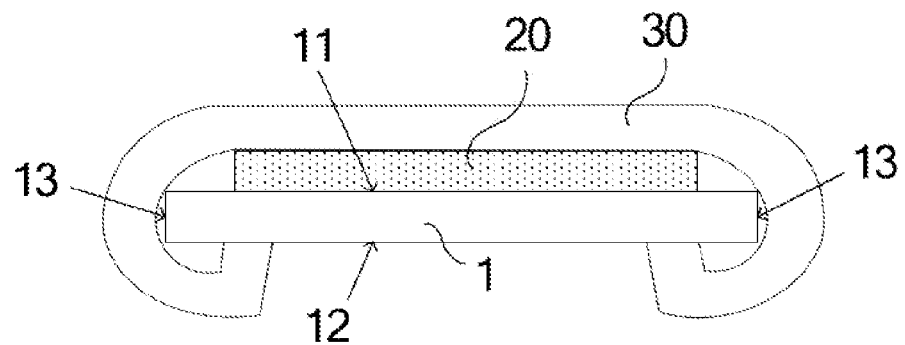
FIG. 3 is a schematic sectional diagram of another package provided by an embodiment.

As shown in FIGS. 2 and 3, the first aspect of the embodiments described herein provides a package including a base substrate 1 including a first surface 11 and second surface 12 that are opposed to each other and a side face 13, the first surface 11 of the base substrate 1 being used for forming a device to be packaged 20 thereon; and a packaging cover-plate 30 surrounding the first surface 11 of the base substrate 1 and being at least in closed connection with the side face 13 and/or the second surface 12 of the base substrate 1, the device to be packaged 20 being formed in an enclosure space formed by the packaging cover-plate 30 and the base substrate 1.

In the package provided in this aspect, the packaging cover-plate is at least in closed connection with the side face and/or the second surface of the base substrate. Specifically, the packaging cover-plate may adhere to the side face and/or the second surface of the base substrate at a contact portion so as to form an enclosure space in which the device to be packaged is enclosed. The packaging cover-plate being at least in closed connection with the side face and/or the second surface of the base substrate is not limited to the circumstance in which the packaging cover-plate contacts the side face and/or the second surface of the base substrate and is in closed connection with them, and the circumstance shown in FIG. 2, in which the packaging cover-plate further contacts the first surface of the base substrate and is in closed connection therewith, is also in the scope of the disclosure.

According to an example embodiment, the packaging cover-plate may be formed of plastic. In the embodiment, the packaging cover-plate may be in closed connection with the side face and/or the second surface of the base substrate, depending on the rigidity of the packaging cover-plate. For example, in the case that the rigidity of the packaging cover-plate is low, the packaging cover-plate may be in contact with and in closed connection with the first surface, the side face and the second surface of the base substrate, as shown in FIG. 2. Alternatively, when the rigidity of the packaging cover-plate is high, it may be in contact and in closed connection with the second surface of the base substrate, as shown in FIG. 3. In particular, the packaging cover-plate may include polyethylene (PE), polyvinylchloride (PVC) or the like.

An embodiment provides a package in which a device to be packaged is formed on a first surface of a base substrate, and a packaging cover-plate surrounds the first surface of the base substrate and is in closed connection with a side face and/or a second surface of the base substrate. This lengthens the path along which water and oxygen travel to the device to be packaged, therefore it is difficult for water and oxygen to corrode the device to be packaged.

In an example embodiment, a water-absorbing and/or oxygen-absorbing material is filled in the enclosure space (the filling space 14 illustrated in FIG. 4) formed by the base substrate 1, the packaging cover-plate 30 and the device to be packaged 20. In this way, water vapor is absorbed when passing this enclosure space and cannot reach the device to be packaged, which improves the packaging effect of the package. Specifically, the water-absorbing material may be drier or the like, such as anhydrous calcium chloride, anhydrous magnesium sulfate, solid sodium hydroxide or the like. The oxygen-absorbing material may be, for example, sodium, nano-composites or the like. The water-absorbing and oxygen-absorbing material may be a mixture of a water-absorbing material with an oxygen-absorbing material. The above examples of the water-absorbing material and the oxygen-absorbing material are only illustrative, and there is no particular limitation on the water-absorbing material and the oxygen-absorbing material in the embodiments described herein.

It is to be noted that the enclosure space formed by the base substrate, the packaging cover-plate and the device to be packaged is not limited to the enclosure space formed at one position and may include enclosure spaces formed at multiple positions. In the embodiments described herein, the filling of the enclosure space 14 shown in FIG. 4 with the water-absorbing and/or oxygen-absorbing material is only taken as an example for illustration.

In an example embodiment, the water-absorbing and/or oxygen-absorbing material may be in solid state and adhere to the base substrate. However, the water-absorbing and/or oxygen-absorbing material may be in liquid state. The water-absorbing and/or oxygen-absorbing material in liquid state may be cured after packaging the packaging cover-plate. In an example embodiment, the water-absorbing and/or oxygen-absorbing material in solid state may be used and is adhered to the base substrate in order to avoid the affection of the volatilization, diffusion or the like of the water-absorbing and/or oxygen-absorbing material on the device to be packaged.

In an example embodiment, the package may further include a packaging film 40 formed in the enclosure space formed by the packaging cover-plate 30 and the base substrate 1. The packaging film 40 is in closed connection with the first surface 11 of the base substrate 1 and the device to be packaged 20 is formed in the enclosure space formed by the packaging film 40 and the base substrate 1. That is, by further packaging the device to be packaged with the packaging film, it is more difficult for water and oxygen to corrode the device to be packaged and the packaging effect of the package is improved.

Furthermore, a water-absorbing and/or oxygen-absorbing material may be filled in the enclosure space formed by the packaging film, the packaging cover-plate and the base substrate so as to further improve the packaging effect.

According to an example embodiment, the packaging film is formed by alternately stacking a layer of organic material and a layer of inorganic material. That is, the packaging film includes a plurality of sub-layers, and one of any two adjacent sub-layers is a layer of organic material and the other thereof is a layer of inorganic material. By forming the packaging film of an organic material and an inorganic material, the packaging film has a better effect of isolating water vapor.

Figure 6:
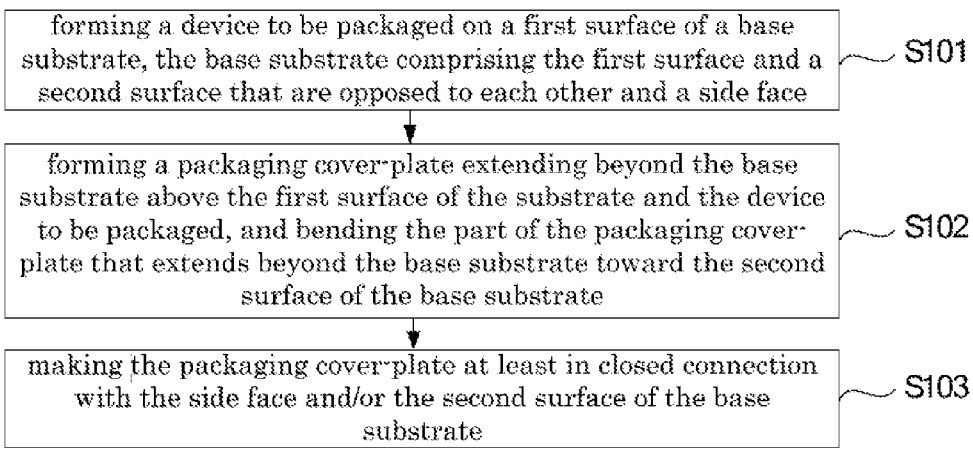
FIG. 6 is a schematic diagram of a manufacturing method of a package provided by an embodiment.

As shown in FIG. 6, a second aspect provides a manufacturing method of a package including the following Steps 101-103.

Step 101: forming a device to be packaged on a first surface of a base substrate, the base substrate including the first surface and a second surface that are opposed to each other and a side face.

Specifically, the method and step for forming the device to be packaged may be different depending on the device to be packaged.

Step 102: forming a packaging cover-plate extending beyond the base substrate above the first surface of the substrate and the device to be packaged, and bending the part of the packaging cover-plate that extends beyond the base substrate toward the second surface of the base substrate.

Step 103: making the packaging cover-plate at least in closed connection with the side face and/or the second surface of the base substrate. Specifically, making the packaging cover-plate at least in closed connection with the side face and/or the second surface of the base substrate may be adhering the packaging cover-plate to the side face and/or the second surface of the base substrate with an adhesive such as glue or the like.

Figure 7:
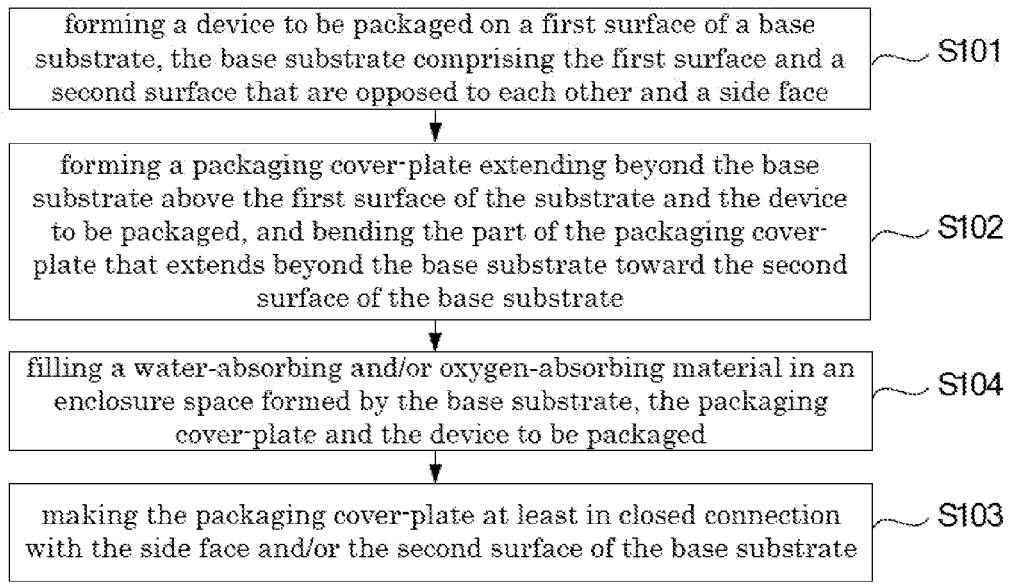
FIG. 7 is a schematic diagram of another manufacturing method of a package provided by an embodiment.
Figure 8:
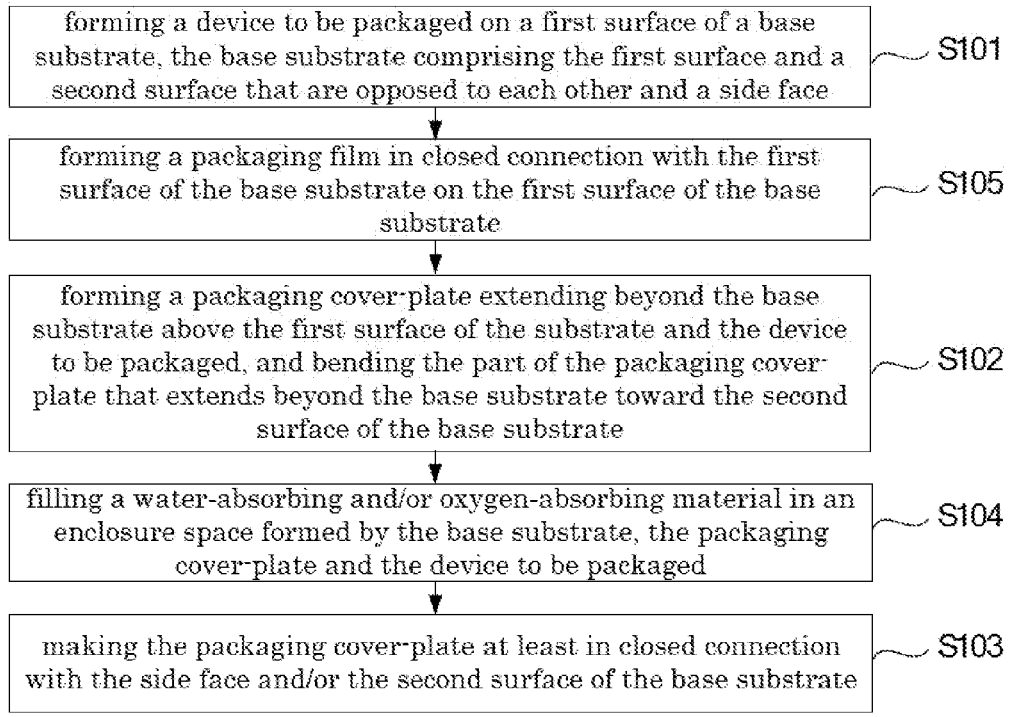
FIG. 8 is a schematic diagram of still another manufacturing method of a package provided by an embodiment.

According to an example embodiment, the method may further include Step 104 as shown in FIG. 7 before Step 103.

Figure 4:
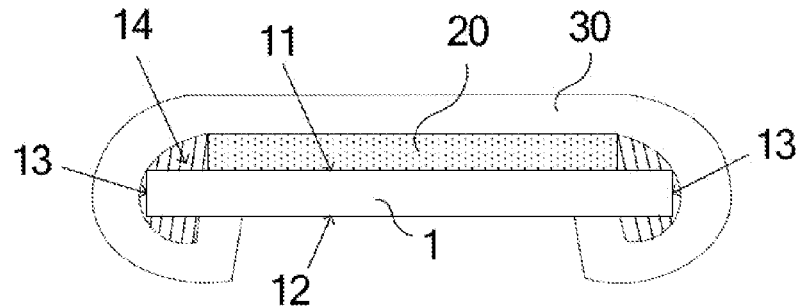
FIG. 4 is a schematic sectional diagram of still another package provided by an embodiment.

Step 104: filling a water-absorbing and/or oxygen-absorbing material in an enclosure space formed by the base substrate, the packaging cover-plate and the device to be packaged. That is, a package as shown in FIG. 4 is formed. Water vapor is absorbed when passing the enclosure space and cannot reach the device to be packaged, which further improves the packaging effect of the package.

According to an example embodiment, the method may further include Step 105 after Step 101 and before Step 102.

Figure 5:
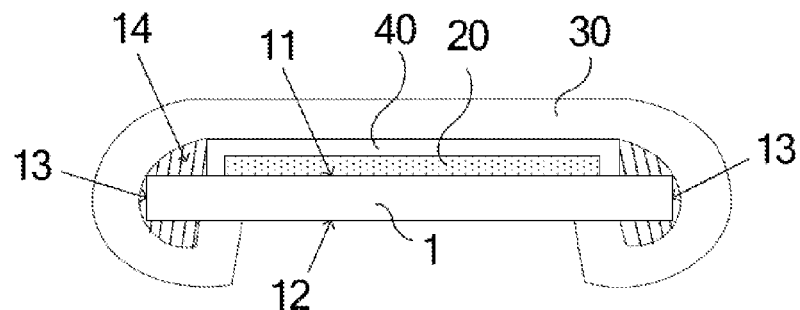
FIG. 5 is a schematic sectional diagram of yet another package provided by an embodiment.

Step 105: forming a packaging film in closed connection with the first surface of the base substrate on the first surface of the base substrate, wherein the device to be packaged is formed in an enclosure space formed by the packaging film and the base substrate. That is, a package as shown in FIG. 5 is formed. By packaging the device to be packaged with the packaging film, it is more difficult for water and oxygen to corrode the device to be packaged and the packaging effect of the package is improved.

Furthermore, a water-absorbing and/or oxygen-absorbing material may be filled in the enclosure space formed by the packaging film, the packaging cover-plate, and the base substrate so as to further improve the packaging effect.

A third aspect provides an OLED apparatus including the package provided in the first aspect, wherein the device to be packaged is an OLED device. The OLED apparatus may be an OLED lamp, an OLED display device or the like.

The description hereinbefore is only for illustrating specific embodiments of the disclosure, and the scope of the disclosure is not limited thereto. Any person skilled in the art would easily conceive of variations or substitutions without departing from the scope disclosed herein and the variations or substitutions would fall into the scope of the disclosure. Therefore, the scope of the present invention should be defined by the appended claims.

What is claimed is:

1. A package, comprising:
   a base substrate comprising a first surface, a second surface opposite the first surface, and a side face, wherein a device to be packaged is formed on the first surface; and
   a packaging cover-plate surrounding the first surface of the base substrate wherein the device to be packaged is formed in a first enclosure space defined by the packaging cover-plate and the base substrate, wherein the packaging cover-plate is directly coupled to the second surface of the base substrate, and wherein a second enclosure space, which is defined by the base substrate, the packaging cover-plate and the device to be packaged, is filled with at least one of a water-absorbing material and an oxygen-absorbing material wherein the package further comprises a packaging film in the first enclosure space, wherein the packaging film is directly coupled to the first surface of the base substrate, and wherein the device to be packaged is encapsulated by the packaging film and the base substrate.

2. The package according to claim 1, wherein the packaging film is formed by alternately stacking a layer of organic material and a layer of inorganic material.

3. An OLED apparatus, comprising the package according to claim 2, wherein the device to be packaged is an OLED device.

4. The package according to claim 1, wherein the packaging cover-plate is formed of plastic.

5. An OLED apparatus, comprising the package according to claim 4, wherein the device to be packaged is an OLED device.

6. An OLED apparatus, comprising the package according to claim 1, wherein the device to be packaged is an OLED device.

* * * * *

UNITED STATES PATENT AND TRADEMARK OFFICE
CERTIFICATE OF CORRECTION

PATENT NO. : 10,096,793 B2
APPLICATION NO. : 15/098495
DATED : October 9, 2018
INVENTOR(S) : Yujing Cao et al.

It is certified that error appears in the above-identified patent and that said Letters Patent is hereby corrected as shown below:

In the Claims

In Claim 1, Column 6, Line 22, delete "base substrate wherein the device" and insert therefor -- base substrate, wherein the device --.

Signed and Sealed this
Fifteenth Day of January, 2019

Andrei Iancu
*Director of the United States Patent and Trademark Office*